United States Patent [19]

Talbot et al.

[11] Patent Number: 5,140,164
[45] Date of Patent: Aug. 18, 1992

[54] IC MODIFICATION WITH FOCUSED ION BEAM SYSTEM

[75] Inventors: Christopher G. Talbot, Menlo Park; Neil Richardson, Palo Alto; Douglas Masnaghetti, San Jose, all of Calif.

[73] Assignee: Schlumberger Technologies, Inc., San Jose, Calif.

[21] Appl. No.: 640,636

[22] Filed: Jan. 14, 1991

[51] Int. Cl.⁵ ......................................... H01J 37/304
[52] U.S. Cl. ................................ 250/492.2; 250/309; 156/626
[58] Field of Search ........... 250/492.2, 492.21, 492.22, 250/398, 309; 324/158 D; 156/626

[56] References Cited

U.S. PATENT DOCUMENTS

| | | | |
|---|---|---|---|
| 4,457,803 | 7/1984 | Takigawa | 156/626 |
| 4,503,329 | 3/1985 | Yamaguchi et al. | 250/492.21 |
| 4,609,809 | 9/1986 | Yamaguchi et al. | 219/121 EM |
| 4,629,898 | 12/1986 | Orloff et al. | 250/396 R |
| 4,706,019 | 11/1987 | Richardson | 324/158 R |
| 4,721,909 | 1/1988 | Richardson | 324/158 R |
| 4,876,112 | 10/1989 | Kaito et al. | 427/38 |
| 4,983,830 | 1/1991 | Iwasaki | 250/309 |

FOREIGN PATENT DOCUMENTS

| | | |
|---|---|---|
| 62-223756 | 10/1987 | Japan . |
| 63-116443 | 5/1988 | Japan . |
| 63-142825 | 6/1988 | Japan . |
| 1-179153 | 7/1989 | Japan . |
| 1-180791 | 7/1989 | Japan . |
| 1-181528 | 7/1989 | Japan . |
| 1-187826 | 7/1989 | Japan . |

OTHER PUBLICATIONS

L. R. Harriott et al., *Integrated circuit repair using focused ion beam milling*, J. Vac. Sci. Technol. B4 (1) pp. 181–184 (1986).

K. Nikawa, *Applications of Focused Ion Beam Technique to Failure Analysis of VLSIs: a Review*, Paper presented at the Second Japan-US Seminar on Focused Ion Beam Applications, Dec. 1990.

N. Richardson, *E-Beam Probing for VLSI Circuit Debug*, VLSI Systems Design (Aug. 1987).

E. Menzel & E. Kubalek, *Fundamentals of Electron Beam Testing of Integrated Circuits*, 5 Scanning 103–122 (1983).

E. Plies & J. Otto, *Voltage Measurement Inside Integrated Circuit Using Mechanical and Electron Probes*, IV Scanning Electron Microscopy 1491–1500 (1985).

S. Concina et al., *Software Integration in a Workstation Based E-Beam Tester*, International Test Conference Proceedings Paper 17.6 (1986).

S. Concina et al., *Workstation-Driven E-Beam Prober*, International Test Conference Proceedings Paper 23.1 (1987).

J. McLeod, *A New Tool Dramatically Cuts VLSI Debugging Time*, Electronics Apr. 30, 1987.

S. Concina and N. Richardson *IDS 5000: an Integrated Diagnosis System for VLSI*, 7 Microelectronic Engineering (1987).

Electrostatic Focused Beam Columns, brochure, FEI Company, Beaverton, Oregon, USA (undated).

Specifications: Post-Lens Deflection Two-Lens LMI Focusing Column, brochure, FEI Company, Beaverton, Oregon, USA (undated).

*Primary Examiner*—Jack I. Berman
*Attorney, Agent, or Firm*—Kenneth Olsen; Keith G. W. Smith; Bruce D. Riter

[57] ABSTRACT

Apparatus is provided which includes a FIB column having a vacuum chamber for receiving an IC, means for applying a FIB to the IC, means for detecting secondary charged particles emitted as the FIB is applied to the IC, and means for electrically stimulating the IC as the FIB is applied to the IC. The apparatus may be used, for example, (1) to locate a conductor buried under dielectric material within the IC, (2) for determining milling end-point when using the FIB to expose a buried conductor of the IC, and (3) to verify the repair of an IC step-by-step as the repair is made.

5 Claims, 14 Drawing Sheets

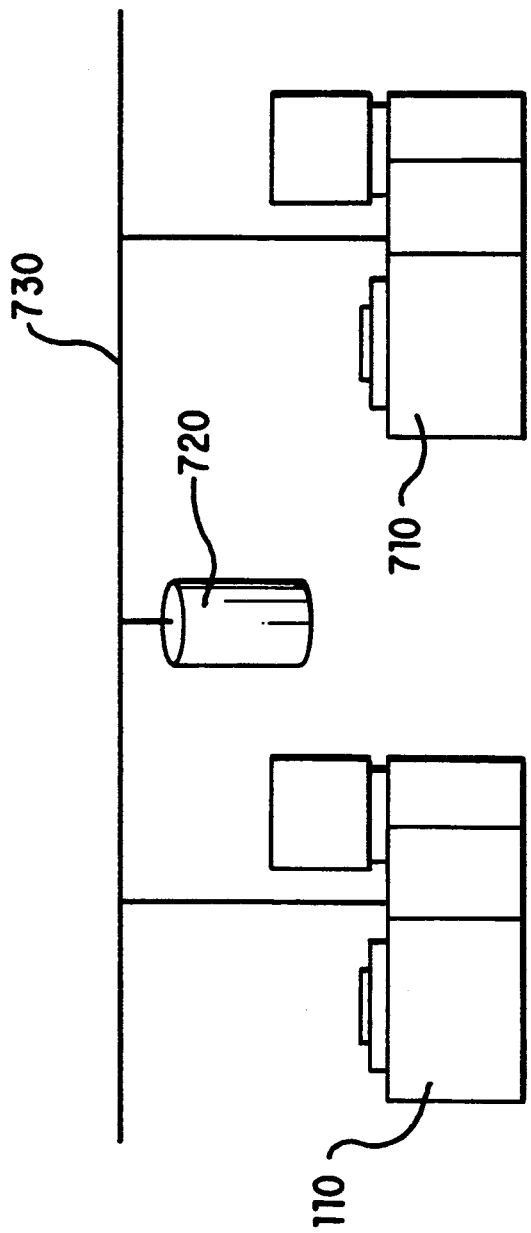

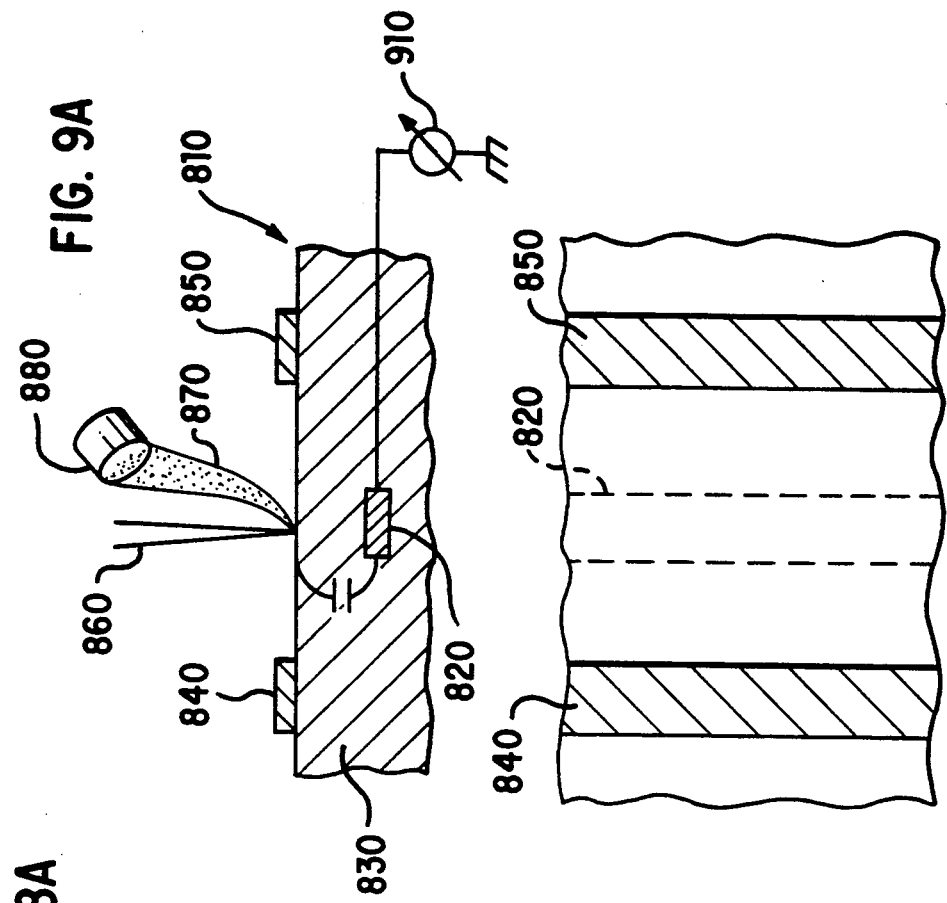
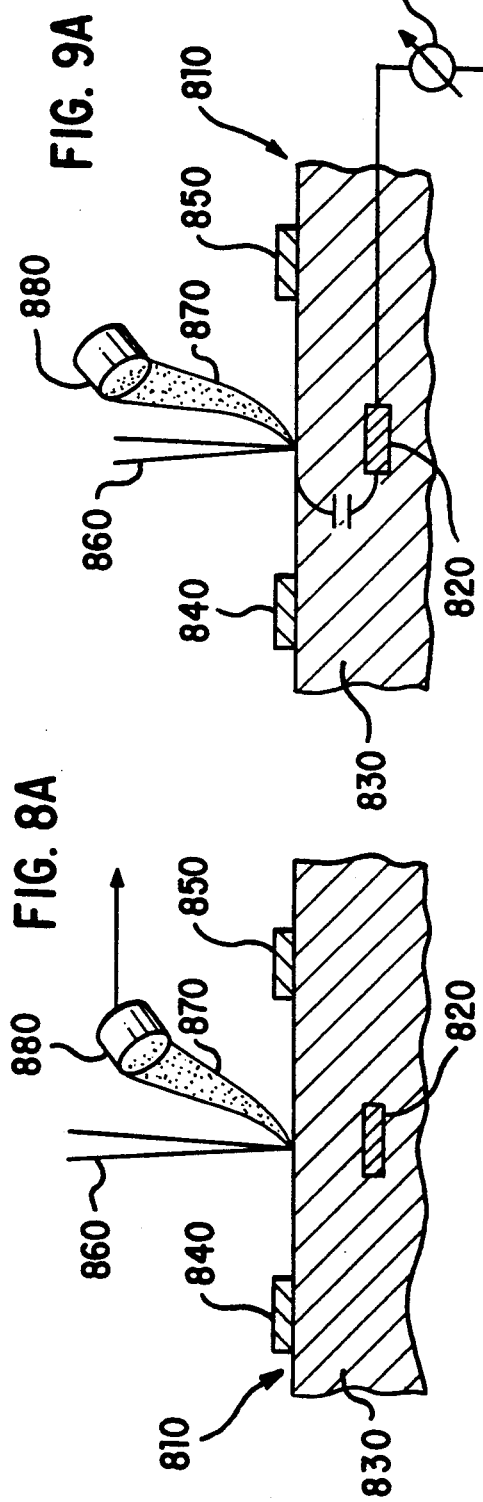
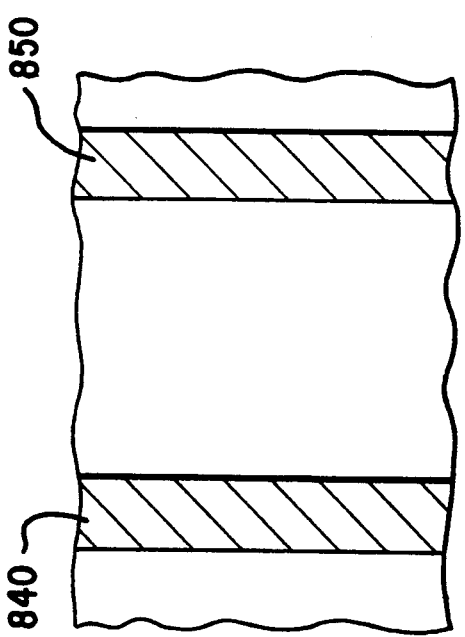

FIG. 10 PRIOR ART
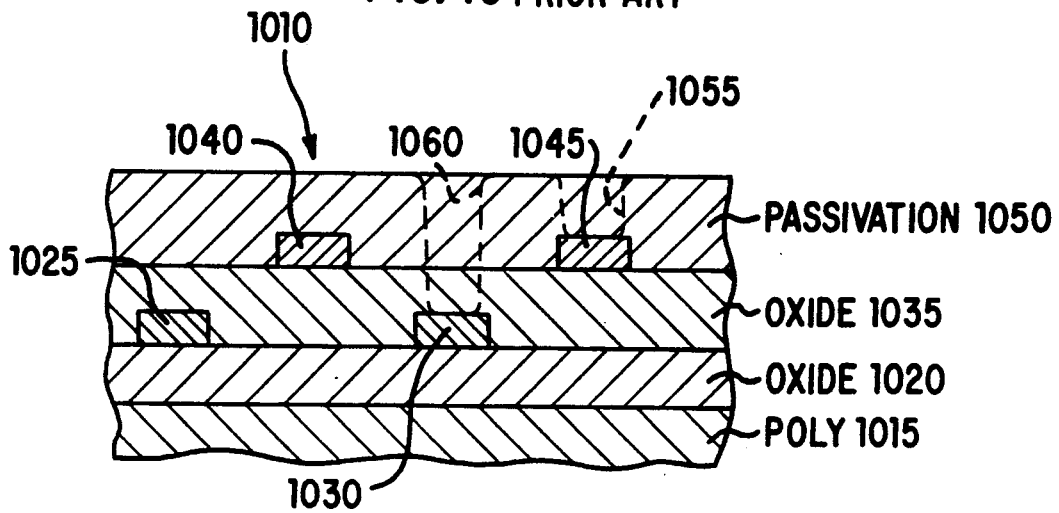
FIG. 11 PRIOR ART
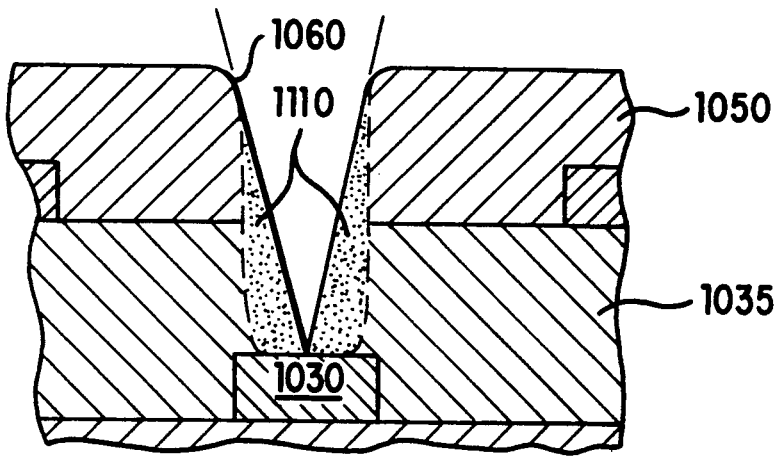
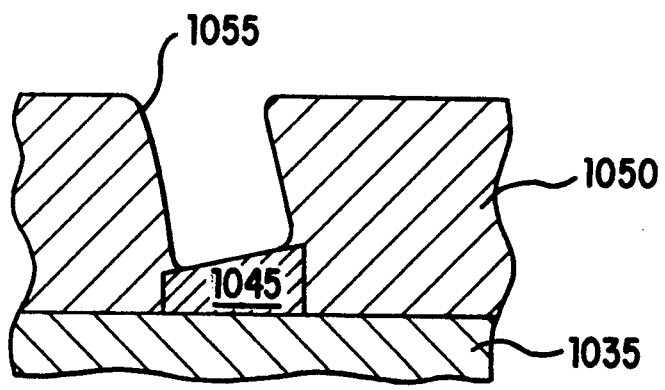
FIG. 12 PRIOR ART

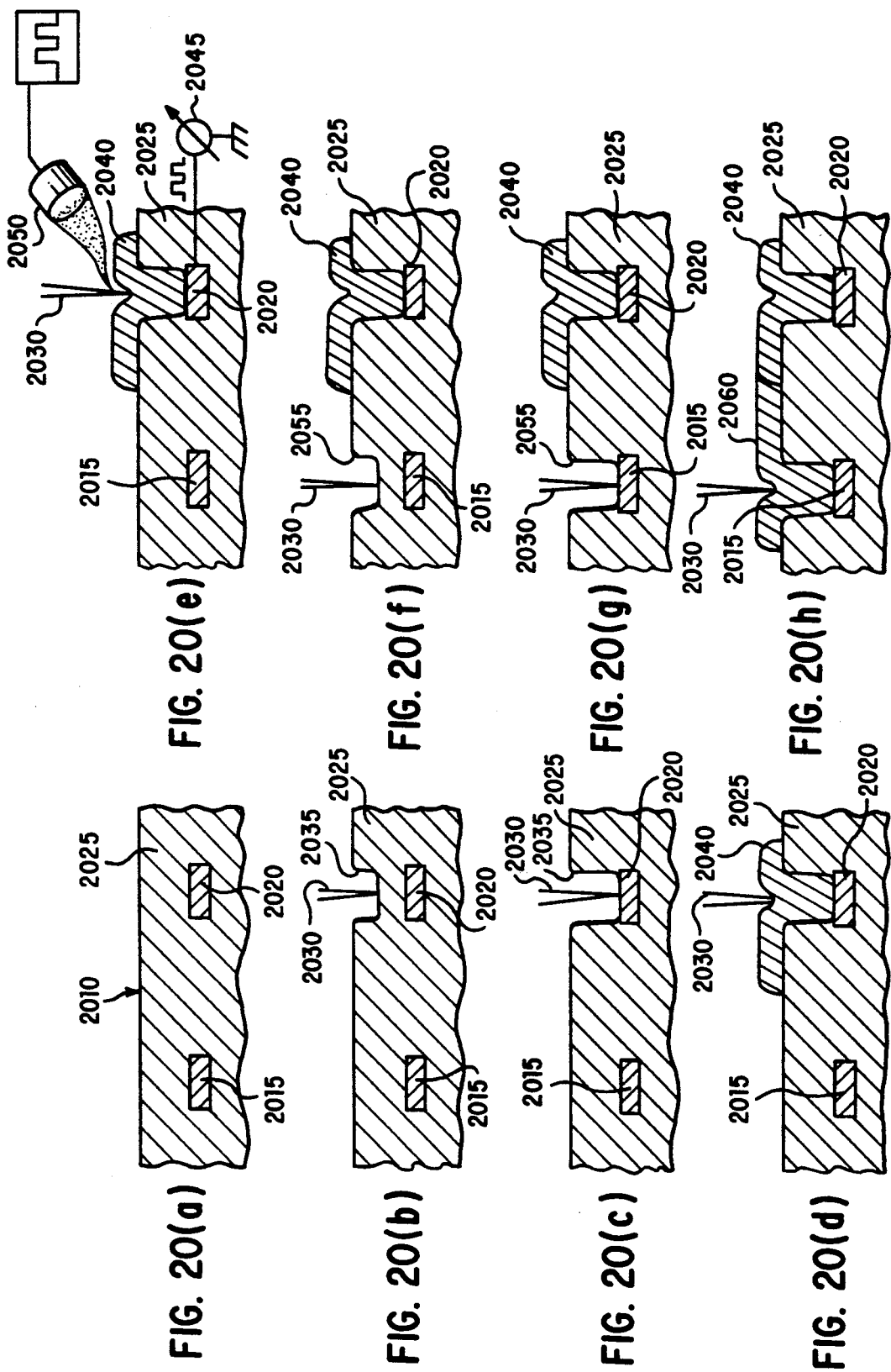

IC MODIFICATION WITH FOCUSED ION BEAM SYSTEM

BACKGROUND OF THE INVENTION

1. Field of the Invention

The present invention relates to focused ion beam (FIB) methods and systems useful, for example, in failure analysis of Very Large Scale Integrated (VLSI) circuit devices. In particular, the present invention relates to methods and systems in which a FIB is employed in locating, milling, and/or depositing conductors within an integrated circuit.

2. The Prior Art

Time-to-market often determines the economic success or failure of new IC devices in the semiconductor industry. Reducing the debug and verification time for new IC designs provides an important competitive advantage. Systems based on Focused Ion Beam (FIB) technology and electron-beam (e-beam) technology are increasingly important in debug and verification as IC design rules shrink below 1 $\mu$m.

Systems based on FIB technology are gaining widespread acceptance in the semiconductor industry in a broad range of applications including IC repair, failure analysis and process monitoring. See, for example, K. NIKAWA, *Applications of Focused Ion Beam Technique to Failure Analysis of VLSIs: a Review*, Paper presented at the SECOND JAPAN-US SEMINAR ON FOCUSED ION BEAM APPLICATIONS, December 1990. A number of general purpose commercial FIB systems are available, but none so far is believed to have an architecture tailored specifically to the needs of the semiconductor industry.

FIB systems are conventionally used to perform three major functions: (1) etching/milling of structure, such as for cutting metal lines and drilling holes, (2) depositing material, such as for forming metal connectors and pads, and (3) scanning ion microscope (SIM) observation. These functions may be employed to modify the IC for failure analysis. For example, cutting and connecting metal lines aids in confirmation of an suspected failure mechanism or failure location, and milling holes in an insulation layer allows a "buried" conductor to be exposed or connected to a pad for improved e-beam or mechanical probing.

However, FIB systems currently in use have significant limitations. In semiconductor fabrication processes where inter-layer dielectric material is used to planarize the IC's surface, conductors buried underneath the surface are often not visible in a conventional SIM image. Milling through the dielectric material to expose a buried conductor poses the difficulty of precisely positioning the FIB over the conductor without being able to observe the conductor.

The FIB IC repair success rate is well known to be poor (typically <50%) particularly when IC modifications are complex or extensive. It is often necessary to modify three devices to obtain one device which works; a small increase in the success rate of modification can thus dramatically increase the time required to obtain a single functioning device. The milling process is sufficiently imprecise that it is possible to mill too deeply and cut through the conductor or mill too little and fail to expose the conductor. The result can be unintended open circuit within the modified IC. Unreliable endpoint detection, i.e., unreliable determination of when to terminate the milling process, particularly on lower level conductors, is frequently cited as the key issue in failed repairs.

Repair of an IC may involve making multiple modifications, reducing the odds of success. Verifying that a repair has been correctly made involves removing the IC from the FIB system and, typically, placing it in an e-beam system where it may be stimulated and probed. Overall, the repair and verification process can be time-consuming and yield uncertain results.

In recent years, voltage-contrast electron-beam (e-beam) probing has gained broad acceptance in the semiconductor industry for applications including IC design debug and verification, failure analysis and characterization. See, for example, N. RICHARDSON, *E-Beam Probing for VLSI Circuit Debug*, VLSI SYSTEMS DESIGN, August 1987. E-beam probing systems and techniques allow signals on internal nodes of an operating IC to be probed, using the principle of voltage contrast in a scanning electron microscope (SEM). A focused beam of primary electrons is directed toward a conductor within a circuit specimen as signals are applied to the specimen. Detected secondary electrons are indicative of the surface electrical potential on conductors within the specimen. See, for example, E. Menzel & E. Kubalek, *Fundamentals of Electron Beam Testing of Integrated Circuits*, 5 SCANNING 103-122 (1983), and E. Plies & J. Otto, *Voltage Measurement Inside Integrated Circuit Using Mechanical and Electron Probes*, IV SCANNING ELECTRON MICROSCOPY 1491-1500 (1985).

Commercial introduction by Schlumberger in 1987 of the "IDS 5000 TM" workstation-based, electron-beam test probe system greatly simplified E-beam probing of circuit chips and increased the efficiency of circuit debug. Among other features, the IDS 5000 system offers tools for "navigation" of an IC so that the e-beam can be rapidly and precisely placed to probe a location of interest while the IC is being electrically stimulated. See S. CONCINA et al., *Software Integration in a Workstation Based E-Beam Tester*, INTERNATIONAL TEST CONFERENCE PROCEEDINGS PAPER 17.6 (1986); S. CONCINA et al., *Workstation-Driven E-Beam Prober*, INTERNATIONAL TEST CONFERENCE PROCEEDINGS Paper 23.1 (1987); J. McLeod, *A New Tool Dramatically Cuts VLSI Debugging Time*, ELECTRONICS Apr. 30, 1987); N. RICHARDSON, *E-Beam Probing for VLSI Circuit Debug*, VLSI SYSTEMS DESIGN (August, 1987); S. Concina & N. Richardson *IDS 5000: an Integrated Diagnosis System for VLSI*, 7 MICROELECTRONIC ENGINEERING (1987); C. TALBOT, *VLSI Inspection Using Electron-Beam Imaging Systems*, PRODUKTRONIKA 87, SENSORIK (1987); and see U.S. Pat. Nos. 4,706,019 and 4,721,909 to N. Richardson, which are incorporated herein by reference.

To summarize, an e-beam system such as the IDS 5000 system aids analysis of the operation of an IC, but does not offer the ability to modify the IC. Existing FIB systems offer the means to modify an IC, but pose difficulties in performing such steps as locating buried conductors, and determining when to terminate milling, and do not allow verification of the sufficiency of a repair.

SUMMARY OF THE INVENTION

It is an object of the present invention to overcome many of the limitations of the prior art as outlined above. It is further an object of the present invention to offer methods and apparatus useful in modifying electronic circuits such as ICs for failure analysis and the like. These and other objects are attained with embodiments of the methods and apparatus of the present invention.

In accordance with one form of the present invention, a system is provided which includes a chamber for receiving an IC, pump means for creating a vacuum in the chamber, means for applying a FIB to the IC, means for detecting charged particles (e.g., secondary electrons or secondary positive ions) emitted as the FIB is applied to the IC, means for electrically stimulating the IC as the FIB is applied to the IC, and means responsive to the detector means for generating a voltage-contrast image of the IC and for linking the voltage-contrast image of the IC with a stored layout of the IC.

With such a system, it is possible to located a conductor buried under dielectric material within the IC, by electrically stimulating the conductor and detecting secondary electrons emitted as the FIB is applied to the surface of the IC. It is also possible to use such a system for determining milling end-point when using the FIB, for example, to expose a buried conductor of the IC. The FIB is used to mill a hole (a "via") through overlying dielectric material, and milling is terminated early, e.g., before the buried conductor is expected to be exposed. The conductor is then electrically stimulated as the FIB is applied, and secondary electrons are detected to obtain a voltage contrast image. The voltage contrast image indicates whether the IC surface to which the FIB is applied is the conductor (DC voltage contrast exhibiting no capacitive decaying of the voltage contrast signal) or is the dielectric material (no signal or AC voltage contrast in which the voltage contrast signal decays over time). The steps are repeated until the voltage contrast signal indicates that the conductor is exposed, and are terminated before the conductor is severed. The technique improves the reliability of exposing a conductor without causing unintended damage.

It is further possible to use such a system to verify the repair of an IC step-by-step as the repair is made. When metal is deposited using the FIB for making electrical contact with a conductor of the IC, it is possible to verify that the contact is good by electrically stimulating the conductor as the FIB is applied to the deposited metal and emitted secondary electrons are detected. The resulting voltage contrast signal is indicative of whether the desired electrical contact has been achieved. The technique is useful in preparing pads for subsequent e-beam or mechanical probing, for example. Similarly, if two conductors are to be connected by depositing metal with the FIB, it is possible to first deposit metal in an effort to establish electrical contact with one of the conductors, then verify that the contact is good before depositing metal to complete the connection to the other conductor. Verification that intended connections are good enhances efficiency and the reliability of the IC modification process, and reduces the time needed to obtain functioning devices.

These and other features and advantages of the invention will become apparent to those of skill in the art from the following description of preferred embodiments of the invention and the accompanying drawing figures.

BRIEF DESCRIPTION OF THE DRAWING

FIG. 7 is a schematic diagram of a network including a focused ion beam system in accordance with the invention and an electron-beam test probe system;

FIG. 8A is a partial, sectional view of a portion of an IC being scanned by a FIB in SIM mode in accordance with a prior-art technique;

FIG. 8B represents a SIM image of the IC portion of FIG. 8A using the prior-art technique;

FIG. 9A is a partial, sectional view of a portion of an IC being scanned by a FIB in SIM mode while being electrically stimulated, in accordance with the present invention;

FIG. 9B represents a SIM image of the IC portion of FIG. 9A in accordance with the present invention, showing the location of a buried conductor;

FIG. 10 is a partial, sectional view of a portion of an IC, illustrating a structure to be modified;

FIG. 11 is a partial, sectional view of a portion of an IC, illustrating a difficulty encountered in trying to expose a deeply buried conductor with a FIB in accordance with a prior-art technique;

FIG. 12 is a partial, sectional view of a portion of an IC, illustrating a further difficulty encountered in trying to expose a buried conductor with a FIB in accordance with a prior-art technique;

FIG. 20 illustrates in a sequence of frames (a) through (h) a preferred technique for verification of IC repair with a FIB in accordance with the present invention.

DESCRIPTION OF THE PREFERRED EMBODIMENTS

Figure 1:
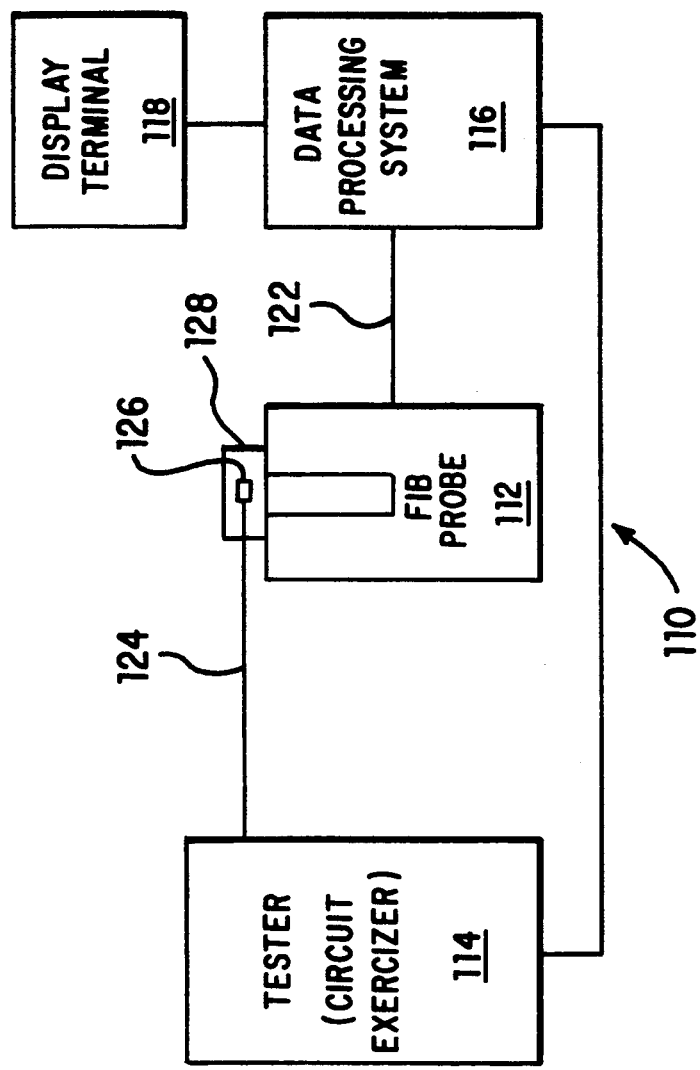
FIG. 1 is a functional block diagram of a preferred FIB system in accordance with the invention.

The architecture of a preferred FIB system 110 is shown schematically in FIG. 1. Such a system is preferably based on the architecture of an e-beam probe system such as an IDS 5000 system (available from Schlumberger Technologies of San Jose, Calif.), to provide a convenient user interface and convenient access to the electronic circuit under test, but with a FIB probe substituted for the e-beam probe.

FIB system 110 has three main functional elements: a FIB probe 112, a circuit exerciser 114, and a data processing system 116 which includes a display terminal 118. An IC 126 is placed in a vacuum chamber 128 of FIB probe 112. Circuit exerciser 114 may be a conventional IC tester, such as a model "S-15 TM" tester available from Schlumberger Technologies, which can repeatedly apply a pattern of test vectors to IC 126 over a bus 124 in response to commands received from data processing system 116 over bus 110. The FIB can be aimed at a desired location on the IC in response to commands supplied from data processing system 116 over bus 122. A charged particle detector within the FIB probe 112 supplies measurements of secondary charged particles (e.g., secondary electrons or secondary positively-charged ions) energy to data processing system 116 over bus 122. Data processing system 116 may be used to specify the test signal pattern used and the timing of measurements relative to the test signal pattern. The electron-beam test probe system 110 is controlled by an operator who inputs commands through the display terminal 118.

Figure 2:
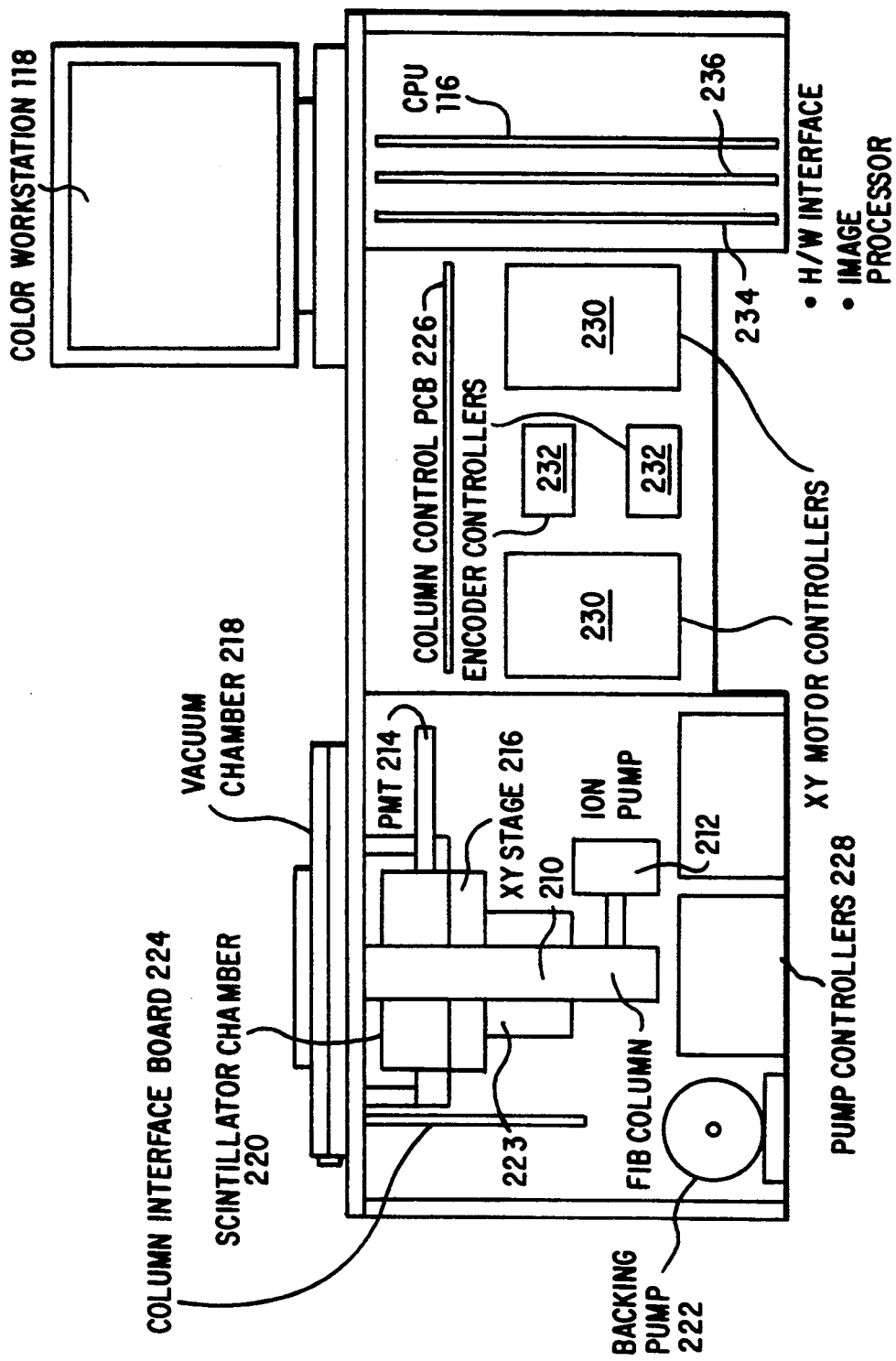
FIG. 2 is a schematic diagram showing a preferred architecture of a FIB system in accordance with the invention.

As shown in FIG. 2, the system may be made completely self contained, requiring only external electrical power and a vacuum chamber exhaust. Referring to FIG. 2, FIB probe 112 comprises a FIB column 210, a charged-particle detector 214, a gas injection assembly (shown at 510 in FIG. 5), and an electron-flood gun assembly (shown at 530 in FIG. 5) mounted on a precision X-Y stage 216 for motion relative to an IC positioned in vacuum chamber 218. Vacuum chamber 218 receives the IC specimen, and is situated above evacuated scintillator chamber 220. The vacuum pumping subsystem, which consists of a rotary backing pump 222, a turbo pump 223 and an ion pump 212, is mounted internal to the system frame and is vibration-isolated from it. A suitable FIB column 210, commercially available from the FEI Company, Beaverton, Oreg., U.S.A., is a conventional two electrostatic lens design and uses a gallium liquid metal ion source (LMIS) which operates at a current density of $\approx 1$ A/cm$^2$.

FIB column 210 is controlled by data processing system 116 via column interface circuitry 224 and 226. Pumps 212, 222 and 223 are controlled by data processing system 116 via pump controllers 228. X-Y stage 216 is controlled by data processing system 116 via X-Y motor controllers 230 and encoder controllers 232. Data processing system 116 includes hardware interface circuitry 234 and an image processor 236.

Figure 3:
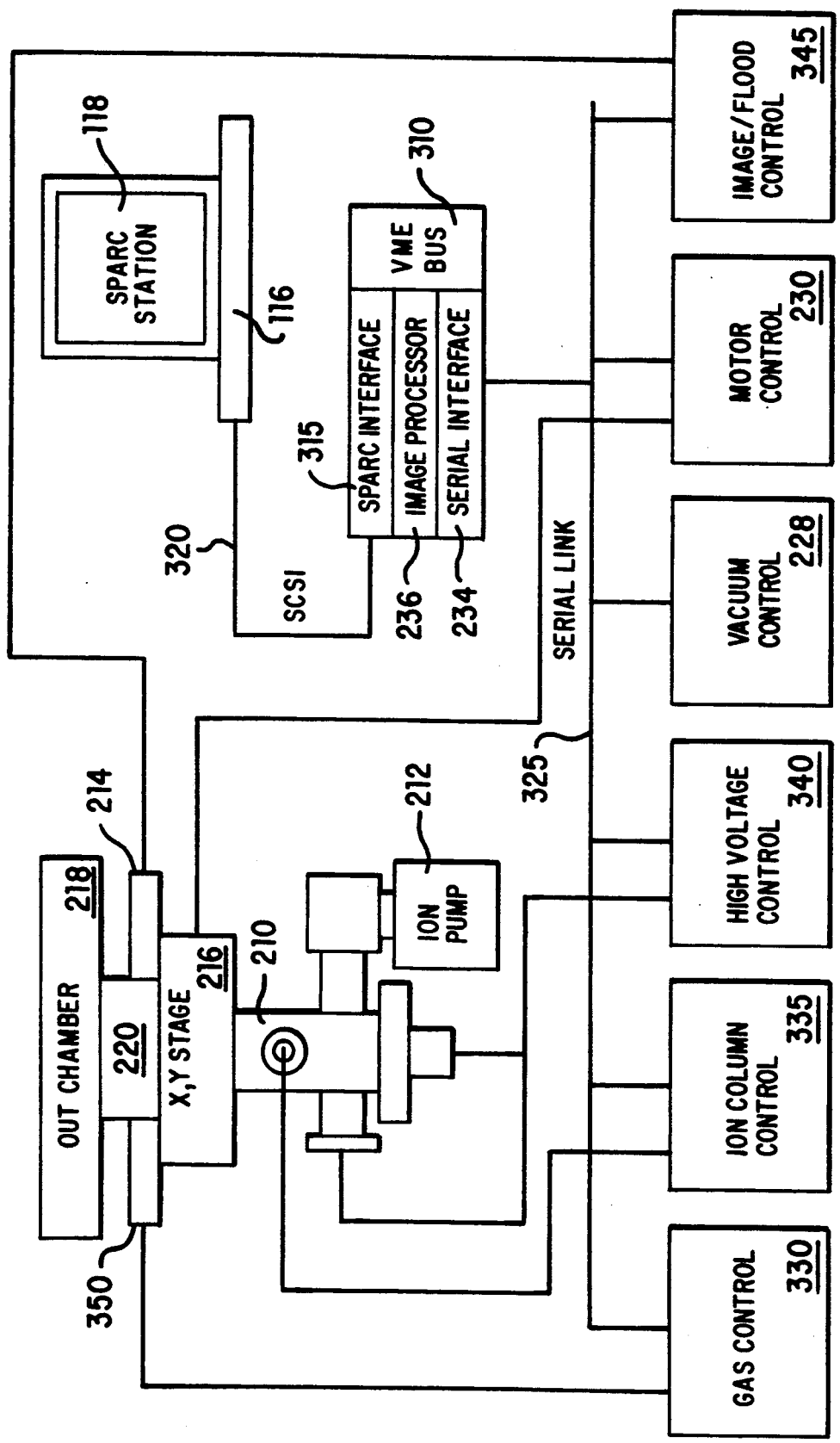
FIG. 3 is a more detailed functional block diagram of a FIB system in accordance with the invention.

For simplicity of illustration, connections between certain elements are not shown in FIG. 2; the functional block diagram of FIG. 3 illustrates principal elements and interconnections of the system. Data processing system 116 may comprise a Sun SPARC Station having an associated display terminal 118. Serial interface 234 and image processor 236 communicate via a VME bus 310 with a SPARC Station interface 315. SPARC Station interface 315 communicates with the SPARC Station via a SCSI bus 320. A serial link 325 provides communication between serial interface 234 and a gas subsystem controller 330, FIB column controller 335, high-voltage controller 340, vacuum controller 228, motor controller 230, and image/flood controller 345. A gas subsystem 350 is provided for selective introduction of gas into the specimen chamber, e.g., a carbonyl gas which allows selective deposition of metal on an IC by application of the FIB. The image/flood controller 345 serves (a) to amplify the detected-electron signal from detector 214 and pass it to image processor 236 for processing into a voltage-contrast image, and (b) to control electron flood gun assembly 530 (FIG. 5).

Figure 4:
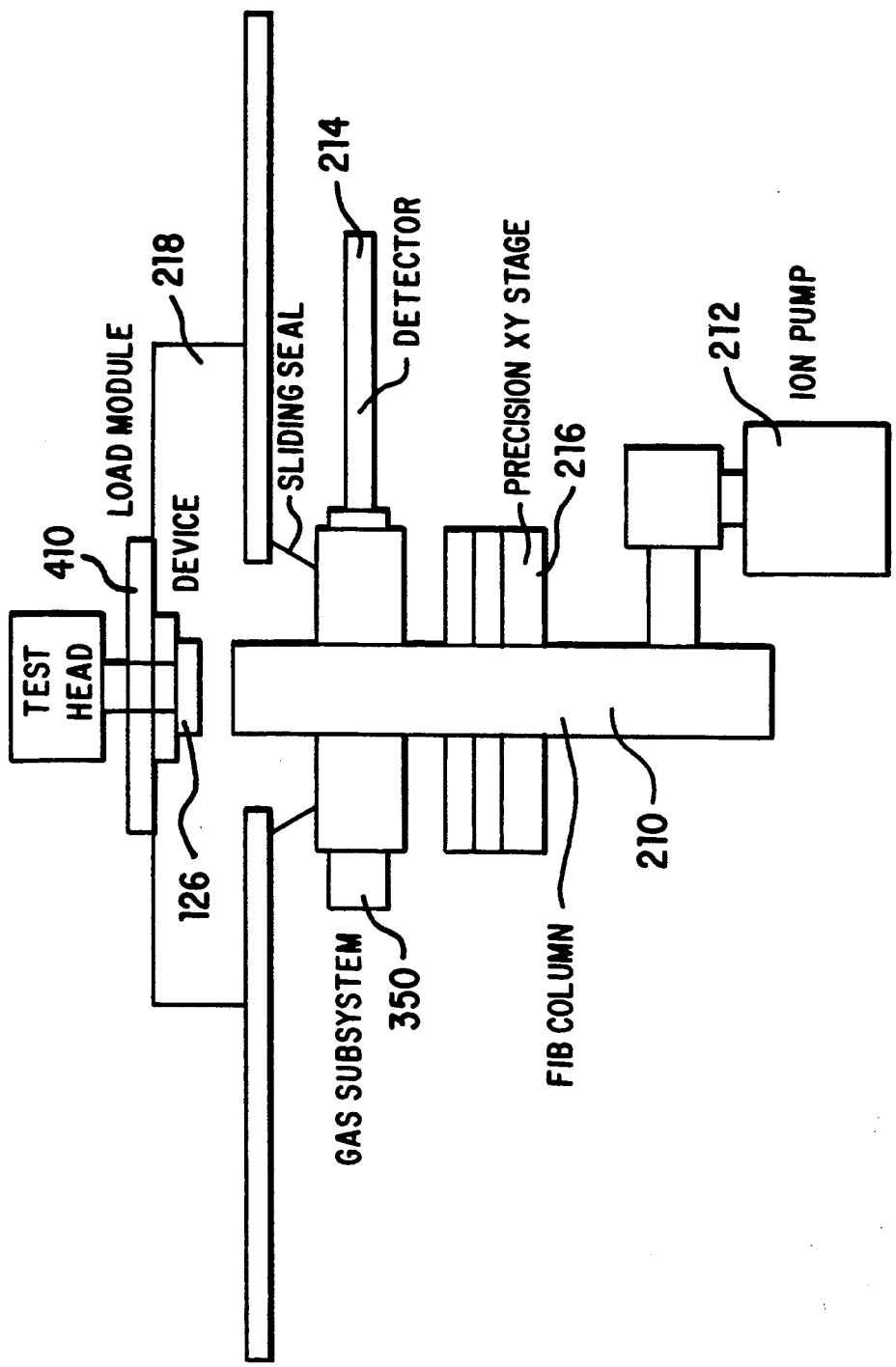
FIG. 4 is a partial, cross-sectional view showing principal elements of the FIB probe in accordance with the invention.

As shown in more detail in FIG. 4, FIB column 210 is inverted and mounted on precision X-Y stage 216. X-Y stage 216 is driven by stepper motors under software control that provide 0.2 $\mu$m step resolution. This provides a direct link with navigation software that allows the user to rapidly and accurately locate internal nodes of a specimen IC directly from the computer-aided-design (CAD) layout and schematic database which is displayed on the screen of display terminal 118. Image pan commands are directly translated into X-Y stage movements to aim the FIB. A specimen IC 126 is electrically coupled to a load module 410 for receiving signals from tester 114.

Figure 5:
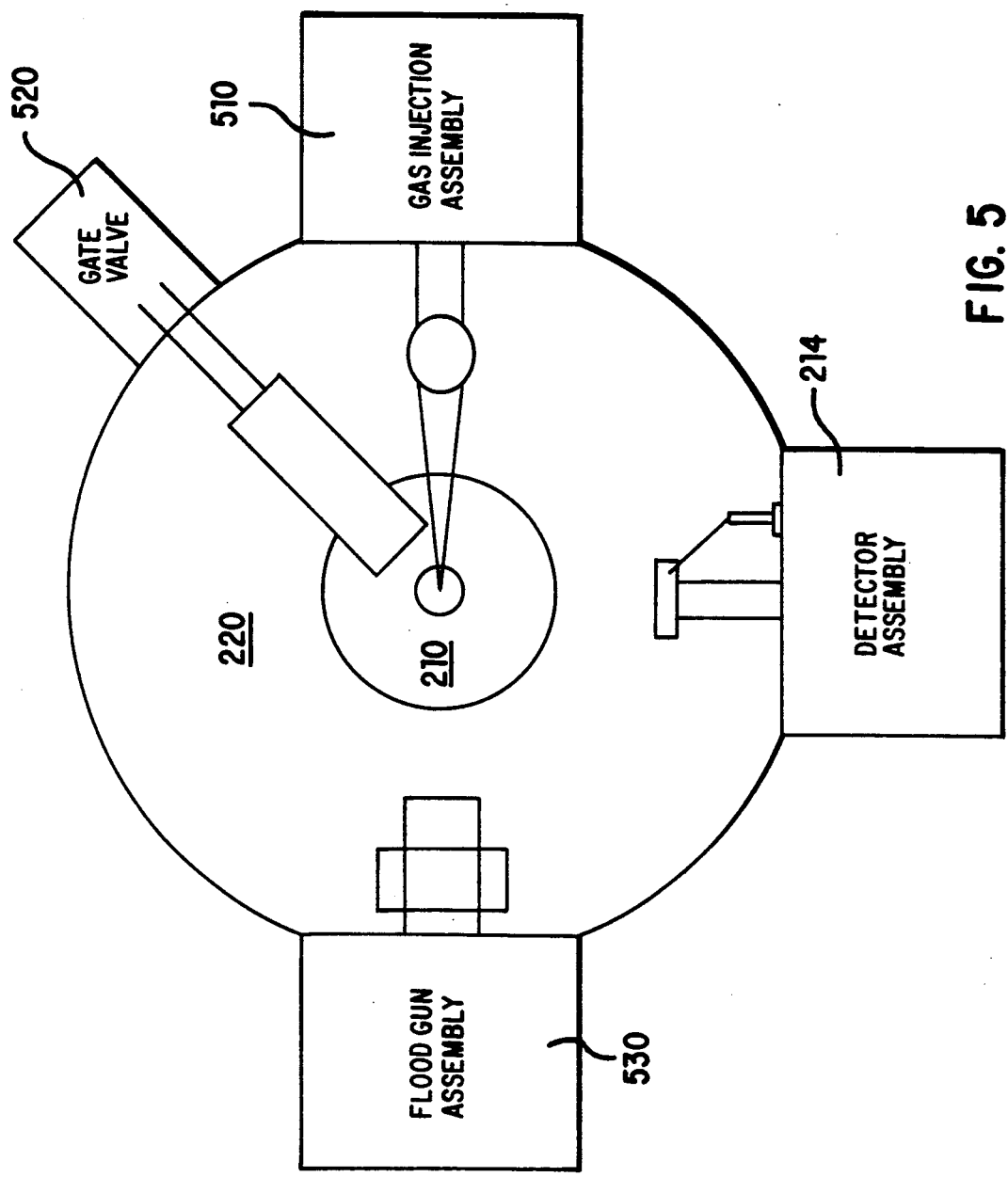
FIG. 5 is a schematic top view of the scintillator chamber of the FIB system in accordance with the invention.

FIG. 5 is a cross-sectional view showing FIB column 210 and scintillator chamber 220. The gas injection assembly 510 of gas subsystem 350, charged-particle detector assembly 214, a gate valve actuator 520 and an electron flood gun 530 are all mounted on the scintillator chamber (see also FIG. 3) below the floor of the specimen chamber 218. FIB column 210 is differentially pumped by ion pump 212. To speed pump-down of specimen vacuum chamber 218 after an IC is installed, a gate valve (see FIG. 5) maintains FIB column 210 at high vacuum when vacuum chamber 218 is brought to atmospheric pressure 218.

The inverted moving column architecture and scintillator chamber configuration give good access to the inside of the vacuum chamber thus allowing easy exchange between various specimen stages. The configuration also provides electrical access to the device in the vacuum chamber. The vacuum chamber is preferably of modular construction so that any of four specimen stages can be mounted, namely, a packaged part stage, a small specimen tilt stage and both manual and motorized precision wafer stages.

Image processor 236 digitizes a 10 MHz video signal from detector assembly 214, calculates a real-time rolling average for image noise reduction, stores the result in one of four frame buffers and performs analog video multiplexing (chroma-key) with the SPARC workstation 100 MHz color video to display the SIM (scanning ion microscope) image directly on the screen of workstation display terminal 118. Bit mapped software access is provided for each of the four frame buffers.

Figure 6:
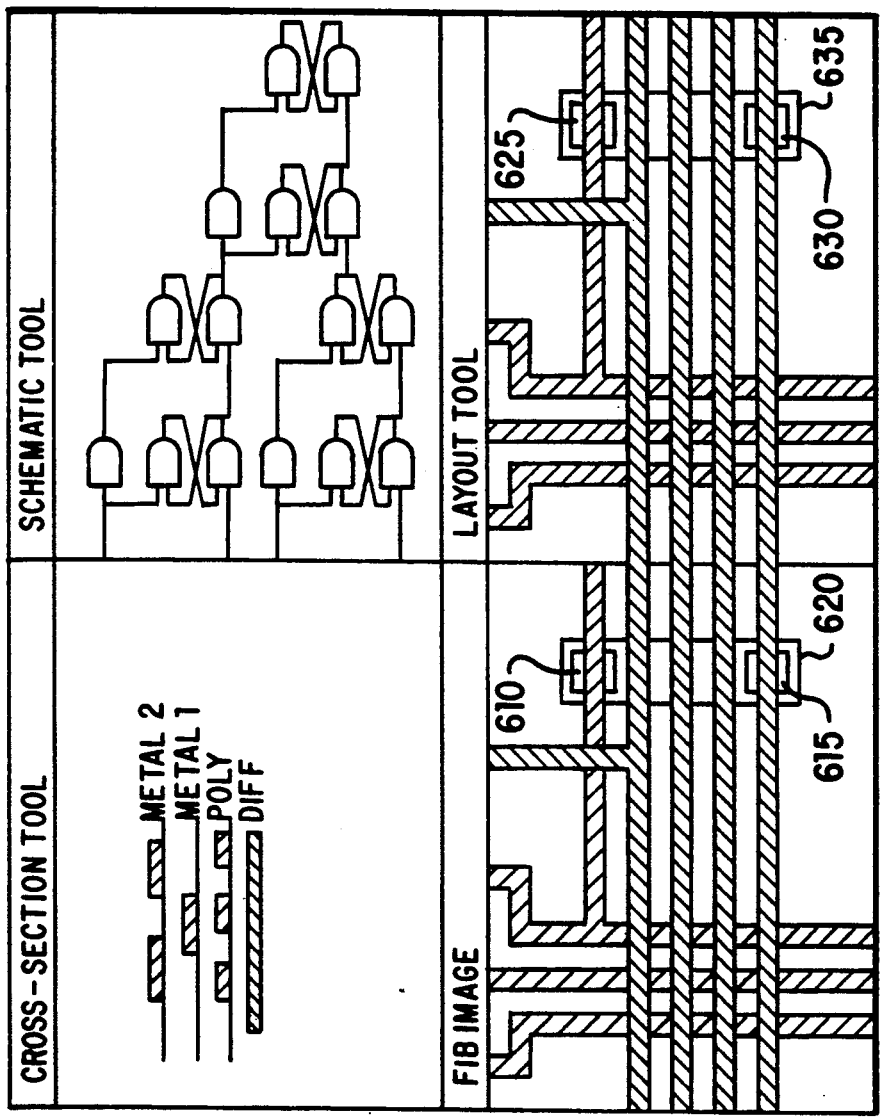
FIG. 6 is an exemplary user-interface display of the FIB system in accordance with the invention.

FIB system 110 is controlled in software from the display terminal 118. The user-interface is modeled on the IDS 5000 e-beam prober user-interface. FIB column adjustments such as alignment, focus, astigmatism and source saturation are readily automated in software. FIG. 6 is a schematic representation of the display screen of terminal 118 showing key software tools:

FIB tool (bottom left) displays either a stored or live, 30 frames per second, black and white SIM image. Typically, device exposure time is minimized to reduce the undesirable effect of milling during imaging. The view of the device in the chamber that is displayed in FIB tool is interactively controlled by simple mouse-driven pan and zoom commands. Pop-up menus allow the user to control simple column functions including contrast, brightness, and focus. The user may also define interactively "cut and deposition" rectangles (e.g., 610, 615 and 620).

Layout tool (bottom right) displays the CAD layout database created during the IC design process. Layout tool and FIB tool in normal operation are locked together. A simple image to database alignment procedure, usually between the four corners of the die and the layout database, corrects automatically for errors in die position, rotation and tilt caused by the IC package. Once alignment is complete, pan and zoom commands entered into either FIB tool or Layout tool are reflected in the other. The two images move in lock step with an error of $<1$ $\mu$m. Layout tool also allows definition of "cut and paste" rectangles (e.g., 625, 630 and 635) in the database coordinate reference frame rather than the non-ideal X-Y stage reference frame used in FIB tool.

Schematic tool (top right) displays the schematic or netlist database. Schematic tool and layout tool are linked at the connectivity level. Thus nets highlighted in the one domain are automatically highlighted in the other tool.

Cross-section tool (top left) displays an idealized device cross-section that is graphically constructed from the layout database and knowledge of the layer ordering and thickness. The process specific information, that is, layer ordering and thickness etc. is available from Cadence' DRACULA technology description file (which is also used for the database preprocessing that is necessary to link the schematic and layout connectivity information). Cross-section tool is used as an aid to interpreting device cross-sections.

Each of the software tools uses the same basic mouse commands and provides access to system peripherals including both black and white, and color hardcopy (not shown).

FIG. 7 shows a FIB system 110, an e-beam probing system 710 (such as an IDS 5000 system) and a data store 720 linked by a local area network 730, such as an Ethernet network. Connecting the FIB system in such a network allows easy exchange of data concerning an IC, so that an IC may be readily modified in FIB system 110 and further analyzed in e-beam probing system 710. As is presented in the previous sections, much of the present FIB system's software environment is identical to that used in e-beam probing. Linking both the FIB and e-beam probing systems with a network allows the user to directly take advantage of the compatibility between the two environments. That is both systems can be used in parallel providing maximum utilization while the advantages of software and hardware compatibility allow for rapid changeover of an IC between the systems.

In most applications the time spent on each system per IC is measured in hours. This is large compared to the typical system to system changeover time and vacuum chamber evacuation time, typically 10 to 15 minutes combined. Thus the time consumed in moving between compatible FIB and e-beam probing systems in most applications is more than compensated by the 2 X improvement in overall systems utilization. The key factor in making the two separate systems approach a practical reality in the eyes of the user is a common user-interface. The networked approach also has the following advantages:

IC CAD databases used in navigation on both systems need only be preprocessed once, stored in one place (that is on either system or on a remote file server) and can be accessed readily by both systems over the network.

Cut and deposition rectangles can be defined remotely from the FIB system on the e-beam prober where problems are first located and characterized.

The network additionally allows for exchange of, and common access to, digitized images, IC XY coordinates and failure analysis reports.

Device Stimulus During Repair

FIG. 4 shows a device in the chamber of the FIB system that is being directly stimulated using, for example, a conventional VLSI tester and test head. This capability is important in FIB applications such as those described below.

Locating Buried Conductors

In semiconductor fabrication processes where the inter-layer dielectric material is used to planarize the IC's surface, conductors buried underneath the surface are often not visible in a conventional SIM image. To illustrate, FIG. 8A is a partial, sectional view of a portion 810 of an IC which includes a conductor 820 "buried" within dielectric material 830, and a pair of conductors 840, 850 in a metallization layer located on the surface of dielectric material 830. A FIB 860 is scanned over the surface as charged particles (e.g., secondary electrons) 870 are detected by detector 880. FIG. 8B represents a SIM image of IC portion 810 which would be obtained using conventional FIB techniques: conductors 840 and 850 are visible in the image due to greater secondary charged-particle emissions from their metal surfaces than from the surrounding dielectric material, but "buried" conductor 820 is not visible.

In accordance with the present invention, buried conductors are electrically stimulated with an AC signal (represented schematically by AC signal source 910) supplied to the IC from tester 114 so as to create voltage constrast, as illustrated in FIG. 9A. AC signals on buried conductors are capacitively coupled to the surface of the IC and are readily visible in a voltage-contrast SIM image. Buried conductors can thus be easily and accurately located. FIG. 9B represents a SIM image of IC portion which would be obtained in accordance with the present invention: conductors 840 and 850 are visible in the image, as is buried conductor 820. Because the AC voltage on conductor 820 is capacitively coupled to the surface, conductor 820 will appear in the SIM image during each cycle of the applied AC signal.

Locating a buried conductor in accordance with the invention may be summarized as follows: stimulating a buried conductor of an IC with an AC signal while scanning the surface of the IC with a FIB and detecting secondary charged particles, and forming a voltage contrast image of the IC from the detected energy of the secondary charged particles, such that the buried conductor is identifiable from the voltage contrast image.

End-Point Detection

FIG. 10 is a partial, sectional view of a portion 1010 of an integrated circuit, illustrating a structure to be modified. The structure is typical of a two-metal, single-poly CMOS process. As illustrated, the structure comprises polysilicon 1015 into which one or more semiconductor devices (not shown) may be diffused, covered by oxide 1020. A metal layer including conductors 1025 and 1030 lies above oxide 1020 and is covered by oxide 1035. A metal layer including conductors 1040 and 1045 lies above oxide 1035. Passivation 1050 covers oxide 1035 and conductors 1040 and 1045.

It may be desired, for example, to expose conductor 1045 by FIB milling of passivation 1050 (as shown by dashed lines at 1055) or to expose conductor 1030 by FIB milling of passivation 1050 and oxide 1035 (as shown by dashed lines at 1060).

FIG. 11 illustrates a difficulty encountered in trying to expose a deeply "buried" conductor such as conductor 1030 with a prior-art technique. As the passivation 1050 and oxide 1035 are bombarded by ions from the FIB, material being milled away splatters out of the hole. However, as the hole becomes deeper, the amount of material which succeeds in leaving the hole declines and residue of the milled material begins to build up in the lower portion of the hole, as represented at 1110. Even if the somewhat higher secondary charged-particle emission from metal from conductor 1030 over that of oxide 1035 and passivation 1050 is detected by monitoring during milling, it is not certain that conductor 1030 will be adequately exposed to enable electrical contact.

FIG. 12 illustrates a difficulty encountered in trying to expose any "buried" conductor such as conductor 1045 with a prior-art technique. If the FIB is not aligned perpendicular to the plane of the IC, it is possible to mill a hole at an angle, resulting in conductor 1045 being exposed, but at least partially milled away in the process.

Figure 13:
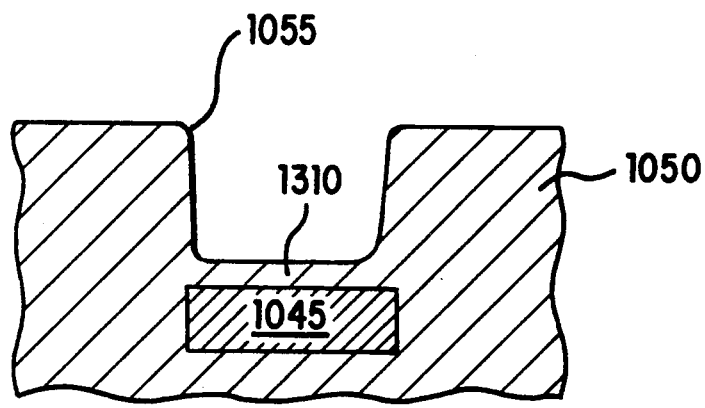
FIGS. 13 and 14 are partial, sectional views of a portion of an IC, illustrating the results of inaccurate end-point detection when milling with a FIB to expose a buried conductor.
Figure 14:
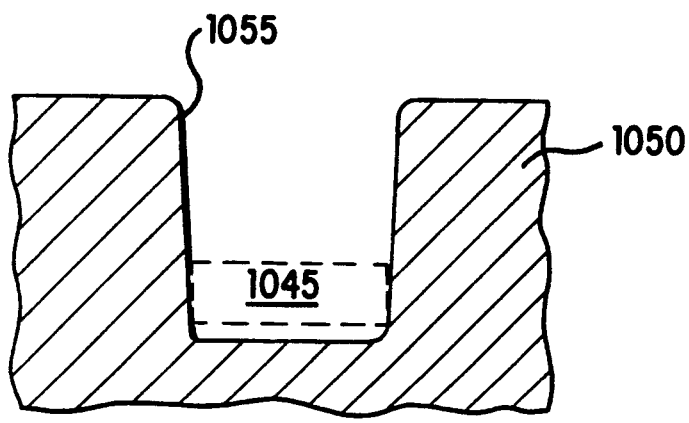
Figure 15:
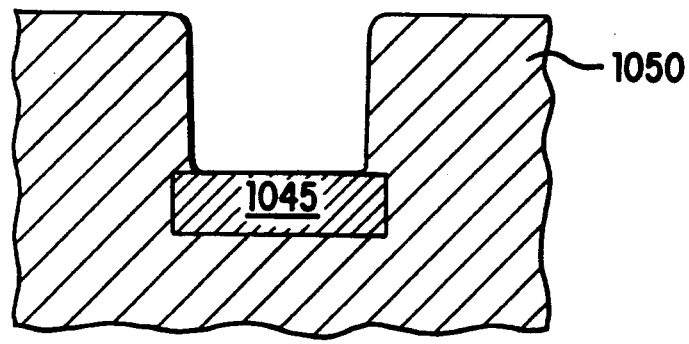
FIG. 15 is a partial, sectional view of a portion of an IC, illustrating the result of correctly milling with a FIB to expose a buried conductor.
Figure 16A:
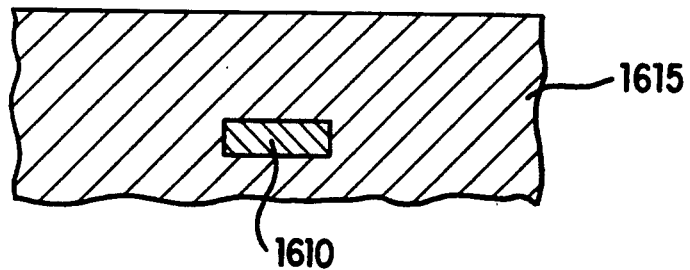
FIG. 16 illustrates in a sequence of frames (a) through (g) a preferred technique for milling end-point detection in accordance with the present invention.
Figure 16B:
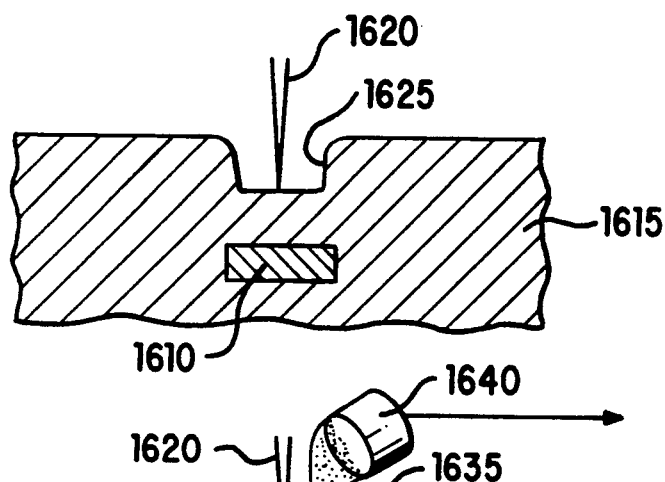
Figure 16C:
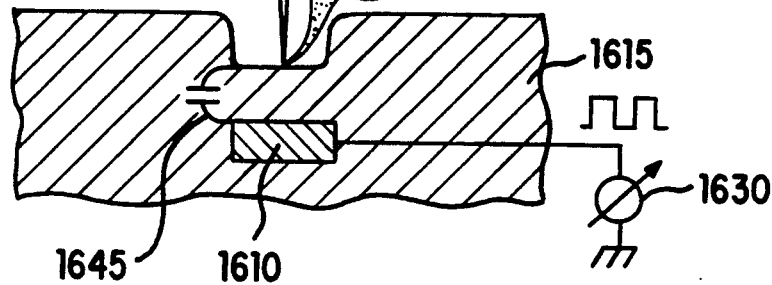
Figure 16D:
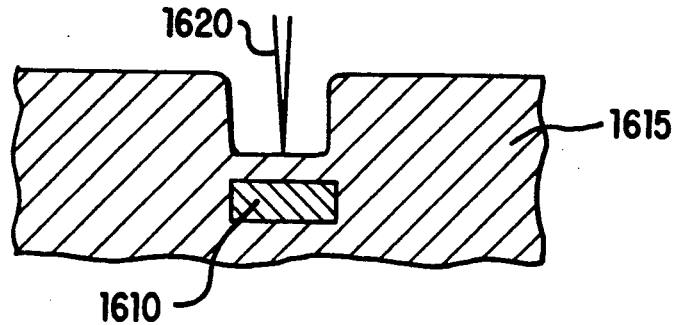
Figure 16E:
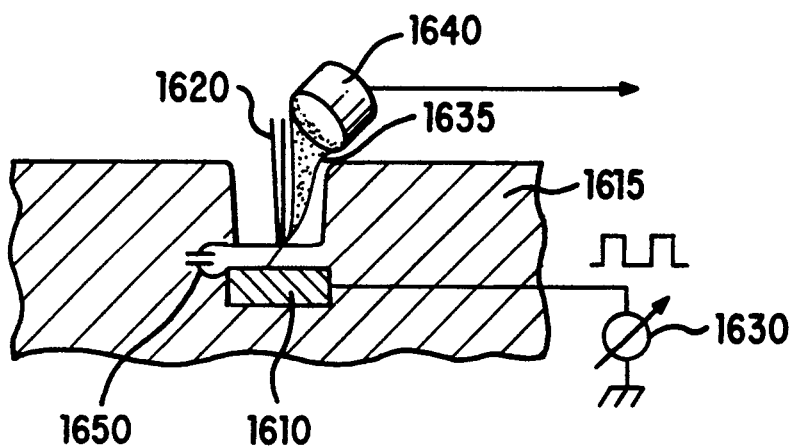
Figure 16F:
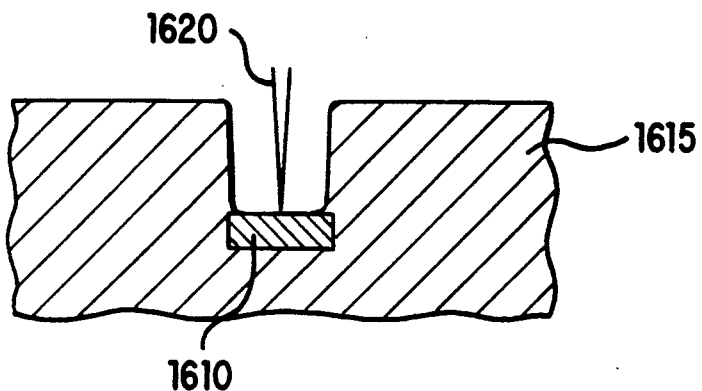
Figure 16G:
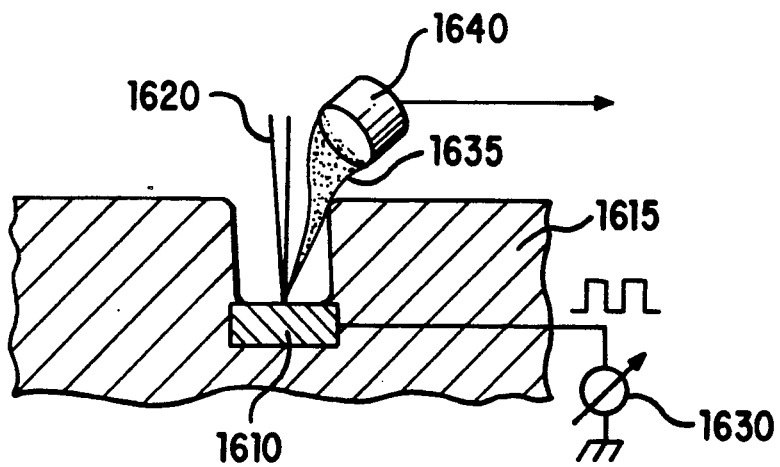

FIGS. 13 and 14 illustrate still other difficulties encountered in trying to expose a "buried" conductor such as conductor 1045 with prior-art techniques. Conductor 1045 may remain insulated by a thin layer of material 1310 if the milling is terminated too soon (FIG. 13), or may be completely severed if the milling continues too long (FIG. 14). Either problem can inadvertently arise due to the imprecise nature of the FIB milling process. Ideally, the milling should be just enough to expose the conductor without damaging it, as shown in FIG. 15.

The voltage contrast phenomenon is also useful in performing end-point detection. Only AC voltage contrast is visible on buried conductors. DC voltage contrast is not visible on buried conductors but is visible on surface conductors, thus allowing buried and surface conductors to be readily differentiated. This fact allows determination of whether, for example, the dielectric material has been removed from a buried conductor and thus allows precise end-point detection of the milling process so that a buried conductor can be exposed in a more uniform and predictable manner.

Figure 17:
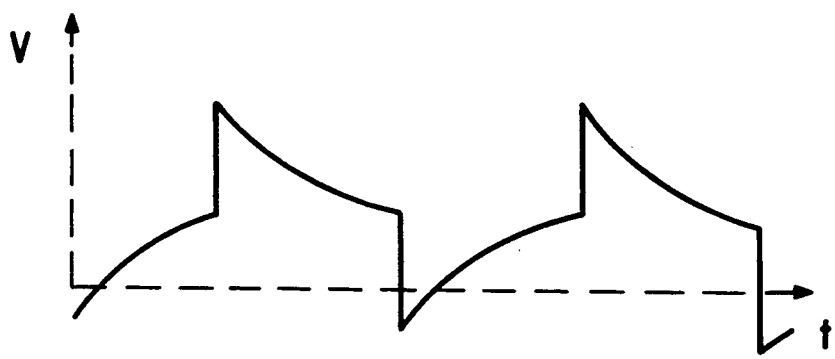
FIGS. 17, 18 and 19 illustrate exemplary signals obtained in carrying out the milling end-point determination technique illustrated in FIG. 16.

FIG. 16 illustrates in sequence (a) through (g) a preferred implementation. Frame 16(a) shows in section a portion of an IC in which a conductor 1610 is buried in a dielectric material 1615. A FIB 1620 is used to mill away dielectric material 1615 to form a hole 1625 as shown in Frame 16(b), but only to a "safe" depth which is sure to avoid milling conductor 1610. Conductor 1610 is then stimulated with an AC signal (represented schematically by AC source 1630) from tester 114, as secondary charged particles (e.g., electrons or positive ions) 1635 are detected by a detector 1640. The AC stimulus signal may comprise a test pattern for the IC which is cycled at a low frequency, e.g., 1 Hz. The voltage contrast signal from detector 1640 will be influenced by the applied AC signal due to capacitive coupling (represented schematically by capacitor 1645) through dielectric 1615 to the surface being milled;

FIG. 17 shows an example of a typical expected voltage contrast signal in which capacitive decay is evident.

The voltage-contrast signal is preferably displayed as a voltage-contrast image of the IC. The changing voltage on the stimulated conductor will cause the stimulated conductor to periodically change intensity in the voltage-contrast image. If the stimulated conductor is capacitively coupled to the surface of the IC, it will cause a "flash" of voltage contrast when changing state, e.g., its voltage contrast intensity will decay rapidly after each transition.

Figure 18:
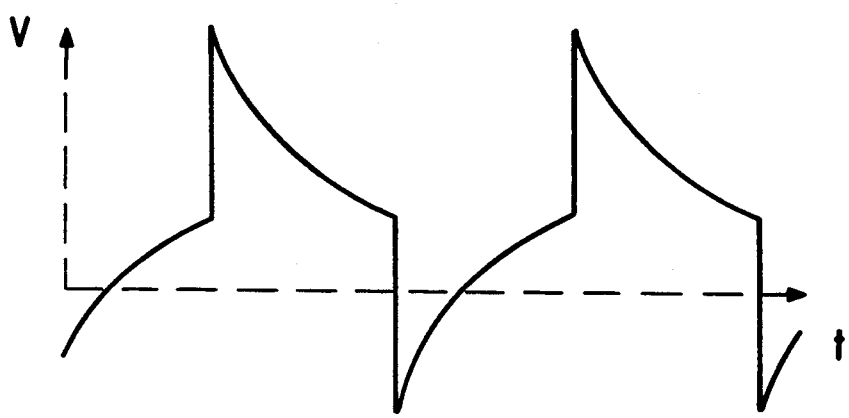

Milling continues as shown in Frame 16(d). Conductor 1610 is again stimulated with an AC signal (represented schematically by AC source 1630 in Frame 16(e)) from tester 114, as secondary charged particles 1635 are detected by detector 1640. The voltage contrast signal from detector 1640 will be influenced by the applied AC signal due to capacitive coupling (represented schematically by capacitor 1650) through dielectric 1615 to the surface being milled. Because the dielectric is now thinner the capacitance at 1650 is greater than that at 1645. FIG. 18 shows an example of a typical expected signal in which the voltage excursions are increased relative to those of FIG. 17 but in which the decay due to capacitance 1650 remains evident.

Figure 19:
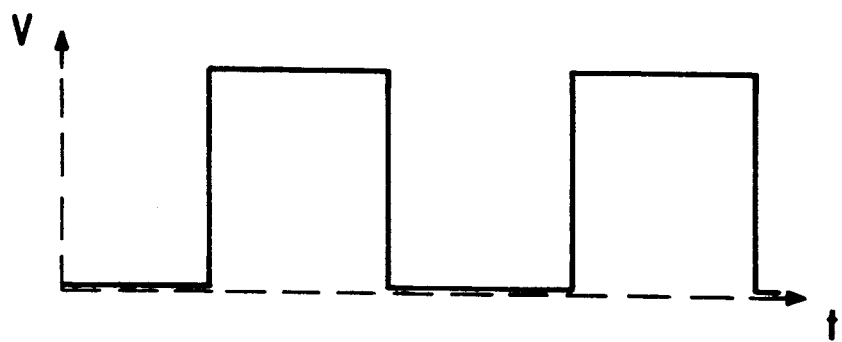

The steps of frames 16(d) and 16(e) are repeated as many times as necessary, until the conductor is exposed by milling as shown in frame 16(f). Conductor 1610 is again stimulated with an AC signal (represented schematically by AC source 1630 in frame 16(g)) from tester 114, as secondary charged particles 1635 are detected by detector 1640. The voltage contrast signal from detector 1640 will be directly influenced by the applied AC signal as conductor 1610 is exposed. FIG. 19 shows an example of a typical expected voltage-contrast signal in which the AC signal applied to conductor 1610 is evident and in which no further capacitive coupling influence is present. When this stage is reached, the intensity of the stimulated conductor in the voltage-contrast image will no longer decay after each transition of the AC stimulus signal, e.g., the conductor's intensity will no longer "flash" in the voltage-contrast image.

The FIB current is preferably adjustable, so that it can be raised during milling (e.g., Frames 16(b), 16(d) and 16(f)) and reduced during signal detection (e.g., Frames 16(c), 16(e) and 16(g)). A typical beam-current range is from 100 pA to 4 nA. Increased current increases FIB spot size, making the milling faster and less precise. Decreased current decreases FIB spot size, making the miller slower but more precise.

Alternate embodiments are also possible, such as continuous electrical stimulation of the conductor and detection of secondary charged particles during milling, so that the end-point detection is continuous during the milling process. Also, it is possible to stimulate a buried conductor for locating it with the FIB, as described above, then continue to scan the FIB over the area to be milled so as to carry out the milling; secondary charged particles are continuously or periodically detected to form a voltage contrast signal (from which a voltage contrast image may be generated and displayed).

Repair Verification

The FIB IC repair success rate is well known to be poor (typically <50%) particularly when IC modifications are complex or extensive. Reliable end-point detection particularly on lower level conductor is frequently cited as the key issue. The ability to stimulate and electrically test a device during the FIB IC repair process improves the success rate by electrically verifying the repair step-by-step. If a particular step is found not to be functional, in many situations it can be corrected in situ and the remainder of the repair procedure completed.

The present invention offers a technique for verifying IC repairs step-by-step as they are made. FIG. 20 illustrates in frames (a) through (h) a preferred implementation. Frame 20(a) shows in section a portion 2010 of an IC in which conductors 2015 and 2020 are buried in a dielectric material 2025. For purposes of the example of FIG. 20, it is desired to repair the IC by establishing electrical contact between conductors 2015 and 2020 using an FIB so that conductor 2015 will drive conductor 2020 when the repair is completed.

Accordingly, a FIB 2030 is directed to mill a hole 2035 to expose conductor 2020, as shown in Frames 20(b) and 20(c). The milling process is preferably carried out using the end-point detection technique described above, and therefore may involve additional steps not shown in FIG. 20. A carbonylic gas is introduced into the vacuum chamber, and metal 2040 is selectively deposited in hole 2035 as shown in Frame 20(d). Before completing the electrical connection between conductors 2015 and 2020, conductor 2020 is driven with a signal (represented by a signal source 2045), while the FIB is operated in SIM mode (preferably at reduced beam current to avoid damage to the IC) with detector 2050 detecting emitted secondary charged particles (e.g., electrons or positive ions). Driving conductor 2020 may be accomplished, for example, by driving the IC with a test vector pattern from tester 114, the pattern being cycled at a low frequency such as 1 Hz. The voltage contrast signal from detector 2050 will indicate whether good electrical contact has been established between metal 2040 and conductor 2020: if DC voltage contrast is observed, the connection is good; if AC voltage contrast (e.g., from capacitive coupling) or no or weak voltage contrast is observed, the connection is bad. If the connection is bad, the effort to establish contact with conductor 2020 (e.g., the steps of Frames 20(a) through 20(e)) can be repeated until a good contact is verified.

Once a good contact is established between metal 2040 and conductor 2020, the repair process may continue. As shown for example in Frames 20(f), 20(g) and 20(h), a hole 2055 is milled to expose conductor 2015 (preferably employing the end-point detection technique described above) and metal 2060 is deposited in an effort to establish contact between metal 2040 and conductor 2015. As conductor 2020 is to drive conductor 2015, a test vector pattern from tester 114 may again be applied to the IC and a determination made whether conductor 2015 is being driven by the signal on conductor 2020. Such determination may, for example, be made by again using the FIB in SIM mode to monitor the signal on conductor 2020.

Variants of the repair verification process are possible. For example, it may be preferred to drill holes 2035 and 2055 (e.g., carry out the steps illustrated in Frames 20(b), 20(c), 20(f) and 20(g)) before depositing metal (Frame 20(d)), verifying connection (Frame 20(e)) and again depositing metal (Frame 20(h)). Also, it may be preferred to continuously or intermittently stimulate a conductor while metal is being deposited over it and while secondary charged particles are detected to produce a voltage-contrast signal; the voltage-contrast signal (or an image generated from it) can thus be monitored during the metal deposition process to determine whether the metal is deposited in electrical contact with the stimulated conductor.

Thus, in a variant of the example of FIG. 20, it is possible to continuously or intermittently stimulate conductor 2020 and detect secondary charged particles while locating conductor 2020, while milling to expose conductor 2020 (Frames 20(b) and 20(c)), and while depositing metal over conductor 2020 (Frame 20(d)).

Conclusion

It can be seen that the present invention offers novel techniques for enhancing the efficiency and reliability of IC modification, particularly with respect to locating buried conductors, more reliably determining milling end-point, and verifying repairs step-by-step. While the additional steps of the present invention may in some cases increase the time needed to effect repair of an IC, the overall efficiency and yield of the repair process is expected to increase by avoiding failed repairs.

The foregoing description of preferred embodiments of the invention is intended to be illustrative only, and not as a limitation of the invention which is defined by the claims which follow. Those of skill in the art will recognize many modifications which may be made in the preferred embodiments within the spirit and scope of the claimed invention.

As used herein, an "electronic circuit" is intended to mean an integrated circuit, a hybrid circuit, an opto-electronic circuit, a multi-chip carrier module (MCM), or any other manufactured item having active and/or inactive elements and/or conductors which may be probed and/or modified with a FIB.

We claim:

1. A method of milling with a focused-ion beam to expose a conductor buried under a dielectric material in an electronic circuit, comprising:
    a. applying a focused-ion beam to mill the dielectric material overlying the conductor;
    b. electrically stimulating the conductor by applying a low-frequency alternating-current signal to the conductor;
    c. detecting secondary charged particles emitted from the electronic circuit as the buried conductor is electrically stimulated and the focused-ion beam is applied;
    d. generating from said detected secondary charged particles a voltage-contrast signal, the voltage contrast signal exhibiting increasingly pronounced capacitive decay until said conductor is exposed by focused-ion beam milling of the dielectric material;
    e. monitoring the capacitive decay of the voltage contrast signal to thereby determine when the conductor is exposed by milling; and
    f. terminating application of the focused-ion beam when the voltage contrast signal no longer exhibits capacitive decay.

2. The method of claim 1, wherein step b. comprises intermittently electrically stimulating the conductor.

3. The method of claim 1, wherein step b. comprises intermittently electrically stimulating the conductor by applying a test vector sequence to the electrical circuit at a low frequency.

4. The method of claim 1, wherein step b. comprises applying an alternating current signal to the conductor at a frequency of about 1 Hz.

5. The method of claim 1, wherein step b. comprises applying an alternating current signal to the conductor at a frequency below 10 Hz.

* * * * *